(12) United States Patent
Herr

(10) Patent No.: US 6,759,974 B1
(45) Date of Patent: Jul. 6, 2004

(54) ENCODER AND DECODER FOR DATA TRANSFER IN SUPERCONDUCTOR CIRCUITS

(75) Inventor: Quentin P. Herr, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/441,842

(22) Filed: May 20, 2003

(51) Int. Cl.[7] .............................................. H03M 7/34
(52) U.S. Cl. ........................... 341/50; 341/51; 375/163; 375/241.25
(58) Field of Search ...................... 341/50, 51; 375/163, 375/240.25

(56) References Cited

U.S. PATENT DOCUMENTS

| | | | | |
|---|---|---|---|---|
| 3,924,186 A | * | 12/1975 | Gordy et al. ............... | 375/281 |
| 5,038,404 A | * | 8/1991 | Marz .......................... | 455/118 |
| 5,172,231 A | * | 12/1992 | Jarick et al. ................. | 348/724 |
| 5,598,105 A | * | 1/1997 | Kurosawa et al. ............. | 326/6 |
| 5,604,497 A | * | 2/1997 | Sonntag ....................... | 341/50 |
| 5,757,822 A | * | 5/1998 | Fisher et al. ................. | 341/59 |
| 5,963,351 A | * | 10/1999 | Kaplounenko et al. ..... | 398/155 |
| 6,185,255 B1 | * | 2/2001 | Twitchell et al. ...... | 375/240.25 |
| 6,185,256 B1 | * | 2/2001 | Saito et al. .................. | 375/257 |
| 6,208,671 B1 | * | 3/2001 | Paulos et al. ................. | 341/61 |
| 6,323,788 B1 | * | 11/2001 | Kim et al. .................... | 341/81 |
| 6,420,895 B1 | | 7/2002 | Herr et al. ...................... | 326/3 |
| 6,507,234 B1 | | 1/2003 | Johnson et al. ............. | 327/528 |
| 6,624,766 B1 | * | 9/2003 | Possley et al. ................ | 341/56 |

OTHER PUBLICATIONS

U.S. patent application Ser. No. 10/324,633, filed Dec. 20, 2002 entitled Instantaneous Clock Recovery Circuit.
U.S. patent application Ser. No. 09/935,037, filed Aug. 22, 2001 entitled Transmission Line Single Flux Quantum Chip–to–Chip Communication with Flip–Chip Bump Transitions.
U.S. patent application Ser. No. 09/934,493, filed Aug. 22, 2001 entitled Double Flux Quantum Superconductor Device.

V. Kaplunenko, V. Borzenets and N. Dubush, T. Van Duzer, "Superconducting single flux quantum 20 Gb/s clock recovery circuit", Appl. Phys. Lett. 71 (1), Jul. 7, 1997, pp. 128–130.

K.K. Likharev and V. K. Semenow, RSFQ Logic/Memory Family: A New Josephson–Junction Technology for Sub–Terahertz–Clock–Frequency Digital Systems, IEEE Transactions on Applied Superconductivity, vol. 1., No. 1, Mar. 1991, pp. 3–28.

* cited by examiner

Primary Examiner—Michael Tokar
Assistant Examiner—Lam T. Mai
(74) Attorney, Agent, or Firm—John A. Miller; Warn, Hoftmann, Miller & LaLone, P.C.

(57) ABSTRACT

A decoder for decoding data transmitted between superconductor circuits. Interleaved data and clock pulses are applied to a clock input of a flip-flop circuit and one input of an AND gate. The output of the flip-flop circuit is a clock signal, and is applied to a delay circuit to be put in phase with the data pulses in the interleaved signal. The delayed clock signal is then applied to the other input of the AND gate, so that when a data pulse occurs in the interleaved signal it aligns with a clock pulse and is outputted from the AND gate. The clock signal from the flip-flop circuit is also sent to the input of the flip-flop circuit through a delay circuit that delays the signal more than one half of the clock period and less than one clock period. This delayed clock signal sets the flip-flop circuit to the "1" state after the data pulse in the interleaved signal are input to the flip-flop circuit so that the data pulses are not outputted from the flip-flop circuit.

23 Claims, 3 Drawing Sheets

ENCODER AND DECODER FOR DATA TRANSFER IN SUPERCONDUCTOR CIRCUITS

GOVERNMENT CONTRACT

The Government may have certain rights in this invention including the right to license others on reasonable terms subject to Government Contract No. N00014-02-2-0001 awarded by the Office of Naval Research.

BACKGROUND OF THE INVENTION

1. Field of the Invention

This invention relates generally to an encoder and a decoder for transferring data between superconducting circuits and, more particularly, to a superconducting encoder that interleaves clock and data signals onto a common line and a superconducting decoder that decodes the clock and data signals interleaved on the common line to extract the data.

2. Discussion of the Related Art

High-speed fiber-optic data transmission systems are known in the art that have data transmission speeds in the 50–200 Gb/s range. Electrical superconducting logic circuits could be employed in these systems to provide supporting circuits that have the performance necessary at these high speeds. Superconducting circuits use single flux quantum (SFQ) voltage pulses to transmit data at low power, low signal loss and high speed.

Superconducting logic circuits employ Josephson junctions instead of transistors as used in semiconductor-based circuits. A Josephson junction is a weak link between two superconducting materials where electrons tunnel across the junction. As long as the current through the junction is less than a junction critical current, the junction will be superconducting. A bias current is applied to the junction that is below the critical current. When additional current from a signal, is applied to the junction so that the current propagating therethrough exceeds the critical current, the junction will switch to a voltage state. The voltage state will induce a quantum leap in the magnetic phase of the junction, which will create an SFQ voltage pulse across the junction. The duration of the SFQ pulse generated at the junction is determined by fundamental physical constants and is h/2e, where h is Planks constant ($6.6262 \times 10^{-34}$ Joule seconds), and e is the fundamental electrical charge ($1.602 \times 10^{-19}$ Coulombs). A typical SFQ pulse has a magnitude of about 1 millivolt and a duration of about 2 picoseconds.

The SFQ pulses can be used to transmit data at very high frequencies. The SFQ pulses can be transmitted and amplified by coupling a series of Josephson junctions together to provide a Josephson transmission line (JTL). When a particular Josephson junction in a JTL receives an SFQ pulse from a preceding Josephson junction, the pulse causes the junction to switch so that the SFQ pulse is recreated to continue propagating along the JTL. A discussion of a JTL operating in this manner can be found in U.S. Pat. No. 6,507,234, issued Jan. 14, 2003 to Johnson et al., assigned to the Assignee of this application, and herein incorporated by reference.

SFQ data pulses are transmitted between circuits or chips, such as analog-to-digital converters (ADC), digital filters, digital switches, etc., in these data transmission systems. Because the data pulses are transmitted at such high speeds, the clock signal that provides data timing is transmitted with the data. This is necessary because a global clock signal cannot be used in each chip because the speed of the clock signal is greater than the uncertainty of the timing of the data pulses. In other words, timing jitter in the data transmission is larger than the period of the clock signal, which prevents the ability to accurately time the data. Therefore, the data signal is encoded with the clock signal before it is transmitted. To be useful, the data encoding scheme must involve an overhead of only a few digital gates, and must be consistent with the return to zero data representation inherent in the circuits of interest. Clock recovery circuits or decoders are necessary in the receiving chip to accurately extract the clock signal from the encoded signal.

In general, a digital data stream may contain a long string of 0s where there are no transitions between the two digital states from which the phase of the data clock can be recovered. If the clock signal is not properly recovered, the data can not be properly retimed, and thus will be interpreted incorrectly at the receiver.

In one known superconducting system, a 60 Gbs data link between superconducting chips uses fixed-width, RZ voltage pulses. This implies that data can be transferred at an on-chip clock rate of up to 30 GHz, even if the clock and data are multiplexed onto the same line. If only data is sent, this system needs to include a clock recovery circuit such as that based on an instantaneous phase reset of a ring oscillator. However, the clock recovery adds significant jitter to the clock, and is only applicable to data with favorable statistics, such as 8 b/10 b encoded data.

SUMMARY OF THE INVENTION

In accordance with the teachings of the present invention, an encoder and a decoder for coding and decoding data transmitted between superconducting circuits is disclosed. The encoder interleaves clock and data signals onto the same signal, and the decoder separates the clock and data signals on the interleaved signal. The SFQ pulses in the clock and data signals need to be 180° out of phase so that the data pulses fall between the clock pulses. If the pulses are not 180° out of phase, a latching circuit can be used to make the pulses in phase and a delay circuit can be used to delay one or the other of the signals by one half of the clock period.

In the decoder, the interleaved data and clock pulses are applied to a clock input of an RS flip-flop circuit and one input of an AND gate. The output of the flip-flop circuit is the extracted clock signal, and is applied to a delay circuit to be put in phase with the data pulses in the interleaved signal. The delayed clock signal is then applied to the other input of the AND gate, so that when a data pulse occurs in the interleaved signal it aligns with a clock pulse and is output from the AND gate. The clock signal from the flip-flop circuit is sent to the input of the flip-flop circuit through a delay circuit that delays the signal more than one half of the clock period, but less than one clock period.

The clock pulses in the interleaved signal put the flip-flop circuit into the "0" state as the SFQ clock pulses are being output therefrom so that when a data pulse between the clock pulses in the interleaved signal is applied to the flip-flop circuit, it is not output as a clock pulse. The delayed clock signal returns the flip-flop circuit to the "1" state after the data pulse has passed so that the next clock signal is output from the flip-flop circuit. Therefore, the clock pulses are output from the flip-flop circuit and the data pulses are not output from the flip-flop circuit. If a data pulse is the first pulse to be applied to the flip-flop circuit on the interleaved signal, the decoder will synchronize to the clock pulses when no data pulse (0 bit) is received between two clock pulses.

Additional advantages and features of the present invention will become apparent from the following description and appended claims, taken in conjunction with the accompanying drawings.

DETAILED DESCRIPTION OF THE EMBODIMENTS

The following discussion of the embodiments of the invention directed towards an encoder for interleaving SFQ data and clock pulses onto a common signal and a decoder for decoding the SFQ data and clock pulses on the interleaved signal is merely exemplary in nature and is in no way intended to limit the invention or its applications or uses.

Figure 1:
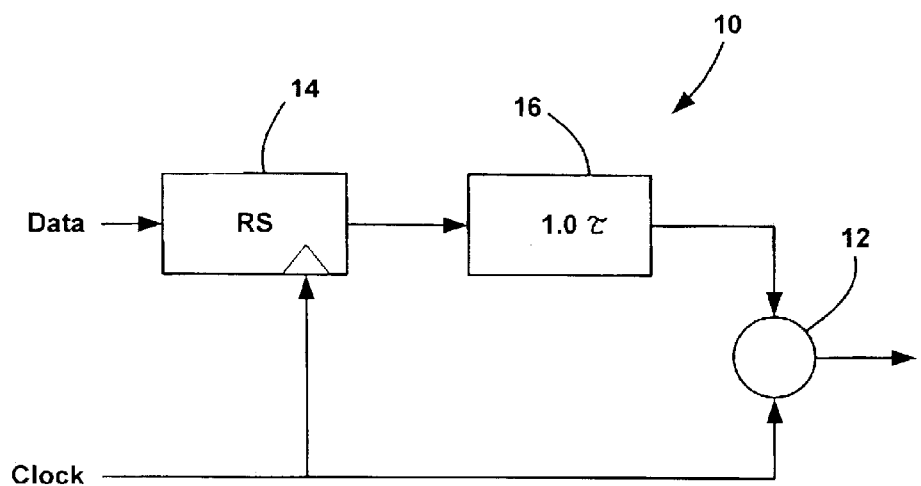
FIG. 1 is a schematic diagram of a superconducting encoder circuit that interleaves SFQ data pulses and SFQ clock pulses onto a single line as an interleaved SFQ signal, according to an embodiment of the present invention.
Figure 2:
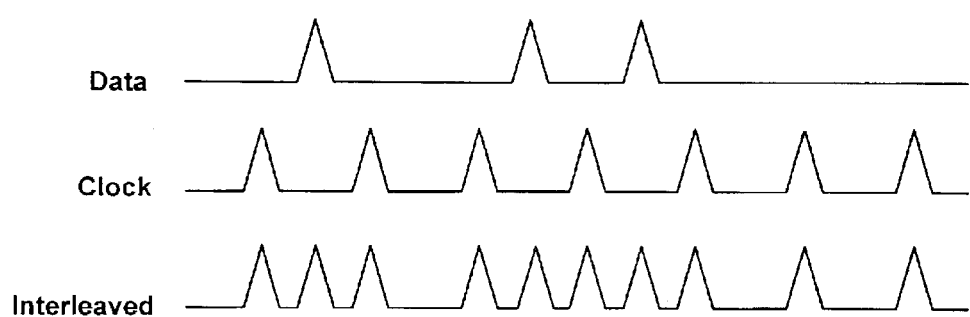
FIG. 2 is a timing diagram showing a digital data stream including SFQ data pulses, a digital clock stream including SFQ clock pulses, and an interleaved stream including both the SFQ data and clock pulses.

FIG. 1 is a schematic diagram of a superconducting encoder circuit 10 for interleaving data and clock signals including SFQ data pulses and SFQ clock pulses onto a common line, according to an embodiment of the present invention. The circuit 10 includes an interleaver 12 for combining the data and clock signals to generate the interleaved signal. The interleaved signal is then transmitted to another superconducting circuit where the clock signal and the data signal are separated to decipher the data. FIG. 2 is a timing diagram showing an exemplary data signal including SFQ data pulses and a clock signal including SFQ clock pulses. The timing diagram also shows the interleaved signal including the interleaved SFQ data pulses and the SFQ clock pulses.

In order to properly interleave the data and clock signals so that they can be decoded, the signals need to be 180° out of phase so that data pulses fall between the clock pulses. If the data and clock signals are not 180° out of phase, the data signal can be applied to an RS flip-flop circuit 14 operating as a latch device. The data signal is applied to the input of the flip-flop circuit 14 and the clock signal is applied to the clock input of the flip-flop circuit 14. The data pulses are clocked out of the circuit 14 by the clock pulses so that the SFQ data pulses and the SFQ clock pulses are in phase at the output of the flip-flop circuit 14. The clocked data signal is applied to a delay circuit 16 that delays the data pulses so that they are 180° out of phase with the clock pulses. Particularly, the data pulses are delayed by $\tau$, which is half of the clock period. The delay circuit 16 can be any superconducting device suitable for the purposes discussed herein, such as a JTL of a suitable length. In an alternative embodiment, the clock pulses can be delayed relative to the data pulses to make them 180° out of phase.

Figure 3:
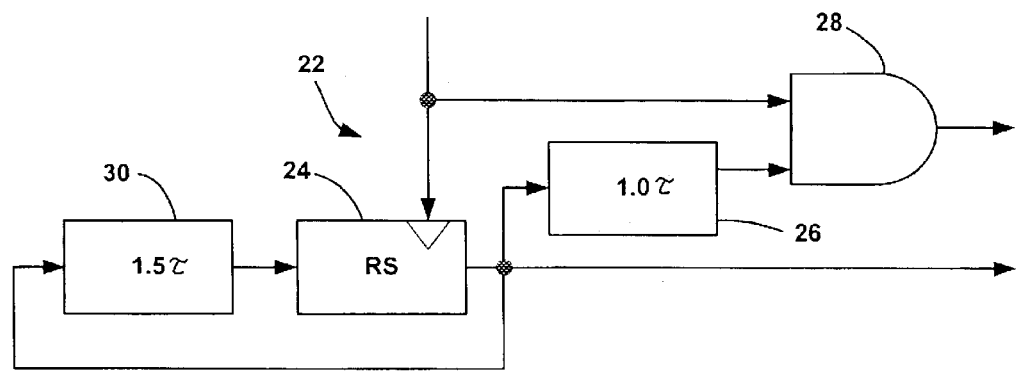
FIG. 3 is a schematic diagram of a superconducting decoder circuit for decoding the interleaved SFQ data and clock pulses generated by the encoder circuit shown in FIG. 1, according to an embodiment of the present invention.

FIG. 3 is a schematic diagram of a superconducting decoder circuit 22 for decoding and extracting the data in the interleaved signal, according to an embodiment of the present invention. The interleaved signal is applied to the clock input of an RS flip-flop circuit 24 and one input of an AND gate 28. The output of the AND gate 28 is the extracted data signal, and the output of the flip-flop circuit 24 is the extracted clock signal. The clock signal is applied to a delay circuit 26 that delays the data signal by half of the clock period (1.0 $\tau$) and the delayed clock signal is applied to the other input of the AND gate 28, so that the data signal and the clock signal are in phase. The clock signal from the flip-flop circuit 24 is also applied to a delay circuit 30 that delays the clock signal between 1.0–2.0 of half of the clock period, here 1.5 $\tau$. The delayed clock signal from the delay circuit 30 is applied to the input of the flip-flop circuit 24. The delay circuits 26 and 30 can also be JTLs of a suitable length.

Figure 4:
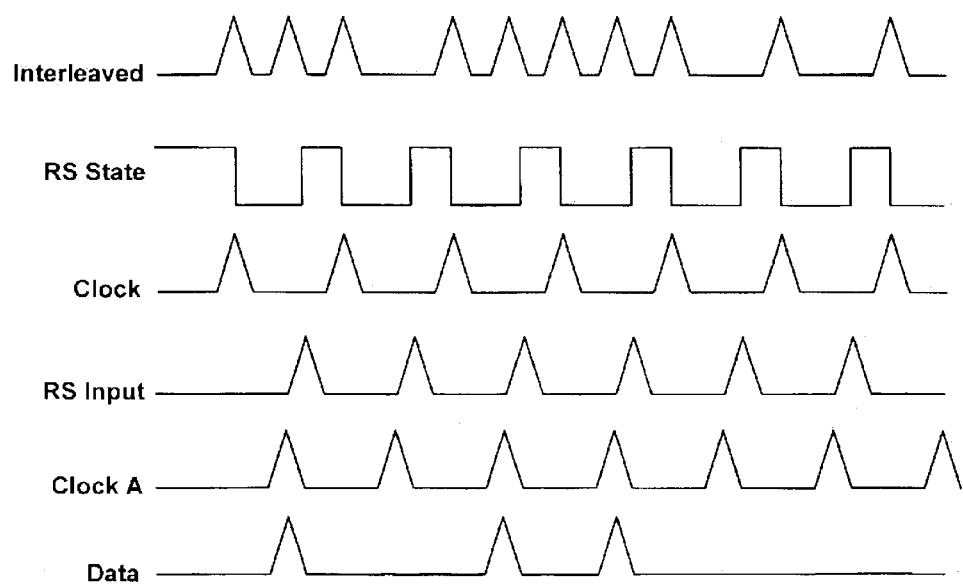
FIG. 4 is a timing diagram showing various SFQ pulse signals in the decoder circuit shown in FIG. 3.

FIG. 4 is a timing diagram showing signals in the decoder circuit 22, including the interleaved signal, the clock signal and the data signal as shown in FIG. 2. In this embodiment, it is assumed that the first SFQ pulse in the interleaved signal applied to the clock input of the flip-flop circuit 24 is a clock pulse. The state of the flip-flop circuit 24 is shown in the timing diagram. The flip-flop circuit 14 is initialized or starts in a "1" state where it will output an SFQ pulse when it receives a pulse at the clock input. Each time the flip-flop circuit 24 receives a clock pulse in the interleaved signal, it outputs the pulse and switches to the "0" state where it will not output an SFQ pulse, as shown in the timing diagram. Each time the flip-flop circuit 24 receives an SFQ pulse at its input (RS input), it returns to the "1" state as shown in the timing diagram. Therefore, when the flip-flop circuit 24 receives at clock pulse at the clock input, it will output an SFQ pulse as a clock pulse.

It is necessary to prevent the flip-flop circuit 24 from outputting an SFQ pulse when an SFQ data pulse is applied to the clock input of the circuit 24 in the interleave line. To prevent this, the clock output of the flip-flop circuit 24 is sent to the delay circuit 30 that delays the SFQ pulses by 1.5 times half of the clock period (1.5 $\tau$). The clock pulses that are delayed by the delay circuit 30 are applied at the input to the flip-flop circuit 24, and switch it from the "0 state" to the "1" state. Because the clock and data pulses in the interleaved signal are 180° out of phase with each other, when a data pulse (one bit) occurs between two clock pulses, the flip-flop circuit 24 is still in the "0" state as a result of the preceding clock pulse, so the data pulse is not outputted as a clock pulse. The flip-flop circuit 14 does not return to the "1" state until after the data pulse is applied to the circuit 24. Thus, because the RS input pulses come 1.5 $\tau$ after the preceding clock pulse, the data pulses between the clock pulses on the interleaved signal are prevented from being outputted from the flip-flop circuit 24.

The clock signal from the flip-flop circuit 24 is applied to the delay circuit 26 that delays the clock pulses by one-half of the clock period so that the clock pulses output from the circuit 26 are 180° out of phase with the original clock pulses, shown as clock A signal line in the timing diagram. This means that the clock pulses now align with the data pulses in the interleaved signal, and thus every time the AND gate 28 receives a data pulse in the interleaved signal at one input, it will receive a clock pulse on the other input, providing an output of the AND gate 28 as a data pulse. The AND gate 28 is a superconducting AND gate, and not the traditional boolean AND gate. In one embodiment, the AND gate 28 is known as a coincident gate that outputs an SFQ pulse each time two coincident SFQ pulses are applied to its inputs.

Figure 5:
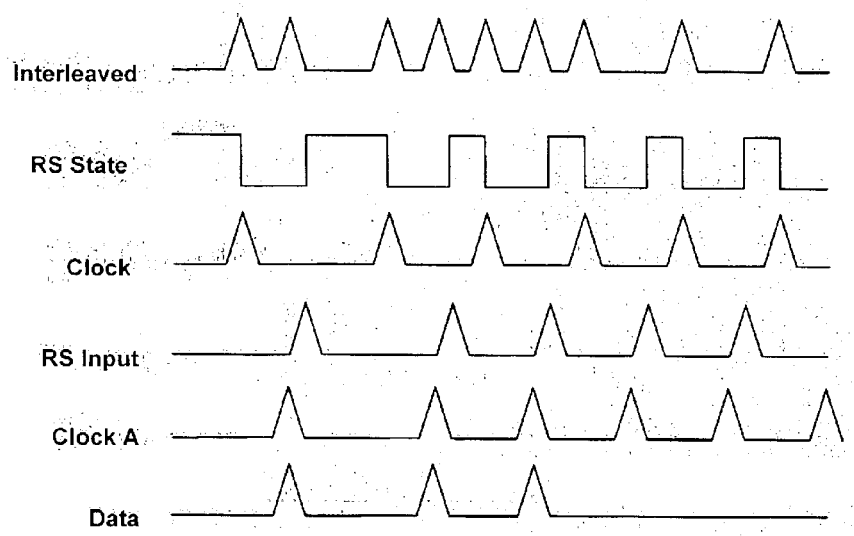
FIG. 5 is a timing diagram also showing various SFQ pulse signals in the decoder circuit shown in FIG. 3.

In one embodiment, the decoder circuit 22 is designed so that the first pulse the flip-flop circuit 24 receives is a clock pulse so that it operates as discussed above. However, if, for whatever reason, the first clock pulse applied to the flip-flop circuit 24 is a data pulse, the decoder circuit 22 will automatically resynchronize to the clock pulses after some period of time. FIG. 5 is a timing diagram for the decoder circuit 22 that shows how the output of the flip-flop circuit 24 becomes the clock signal in this situation. As will be discussed in more detail below, the decoder circuit 22 will resynchronize to the clock signal after no data pulse is received between two clock pulses. In other words, the flip-flop circuit 24 starts outputting the clock signal after a zero bit in the data signal is received.

As shown in FIG. 5, the flip-flop circuit 24 first receives a data pulse, and outputs the data pulse as a clock pulse and switches to the "0" state. The flip-flop circuit 24 is then reset to the "1" state 1.5 τ later from the feedback of the pulse outputted from the flip-flop circuit 24 through the delay circuit 30. The next pulse in the interleaved signal is actually a clock pulse, but the flip-flop circuit 24 is in the "0" state when this pulse arrives, so it does not get outputted from the circuit 24 as a clock pulse. When the delayed pulse from the circuit 24 is applied to the input of the circuit 24 to switch it to the "1" state, the next pulse received on the interleaved line does not exist because there is no data at this location. Therefore, the flip-flop circuit 24 remains in the "1" state until the next pulse, which is a clock pulse. This pulse is clocked out of the flip-flop circuit 24 as a clock pulse, and the circuit 22 is now synchronized to the clock pulse because for every 2 τ time period, a clock pulse should occur in the interleaved signal line.

Figure 6:
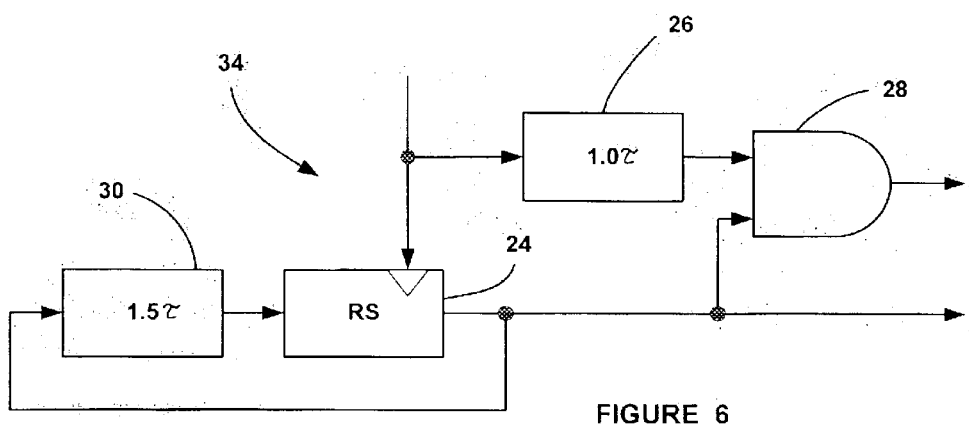
FIG. 6 is a schematic diagram of a superconducting decoder circuit for decoding the interleaved SFQ data and clock pulses generated by the encoder circuit shown in FIG. 1, according to another embodiment of the present invention.

FIG. 6 is a schematic diagram of a decoder circuit 34 similar to the decoder circuit 22, where like reference numerals identify common elements, for decoding the data on the interleaved signal line, according to another embodiment of the present invention. The delay circuit 26 in the decoder circuit 22 delayed the clock signal so that the SFQ clock pulses aligned with-the SFQ data pulses in the interleaved signal. In the decoder circuit 34, the delay circuit 26 is used to delay the interleaved signal before it is applied to the AND gate 28 so that the data pulses in the interleaved signal align with the clock pulses from the flip-flop circuit 24.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A superconducting encoder for encoding a clock signal and a data signal, said clock signal Including SFQ clock pulses and said data signal including SFQ data pulses where an SFQ data pulse represents a one bit, said encoder comprising an interleaver, said interleaver being responsive to the data signal and the clock signal and generating an interleaved signal including the data and clock signals, where the SFQ data pulses and the SFQ clock pulses are 180° out of phase.

2. The encoder according to claim 1 further comprising a latch device and a delay device, said latch device being responsive to the clock signal and the data signal where the latch device outputs the data signal so that the SFQ data pulses are in phase with the SFQ clock pulses, said delay device being responsive to and delaying the data signal output from the latch device to make the clock pulses and the data pulses 180° out of phase with each other before being applied to the interleaver.

3. The encoder according to claim 1 further comprising a latch device and a delay device, said latch device being responsive to the clock signal and the data signal where the latch device outputs the data signal so that the SFQ data pulses are in phase with the SFQ clock pulses, said delay device being responsive to and delaying the clock signal to make the clock pulses and the data pulses 180° out of phase with each other before being applied to the interleaver.

4. The encoder according to claim 2 wherein the delay device is a Josephson transmission line.

5. The encoder according to claim 1 wherein the clock signal operates at a speed between 20–200 Gb/s.

6. A superconducting decoder for decoding a data signal and a clock signal encoded on an interleaved signal, said data signal including SFQ data pulses and said clock signal including SFQ clock pulses that are 180° apart in phase, said clock pulses defining a clock period, said decoder comprising:

a flip-flop device responsive to the interleaved signal, said flip-flop device outputting the clock signal;

a first delay device responsive to the clock signal from the flip-flop device, said first delay device delaying the clock signal for a time period between one half of the clock period and one clock period and generating a first delayed clock signal, said first delayed clock signal being applied to the flip-flop device, said first delayed clock signal putting the flip-flop device in a "1" state at a time that prevents data pulses in the interleaved signal from being outputted from the flip-flop device;

an AND device responsive to the clock signal and the interleaved signal, said AND device outputting the data signal; and a second delay device receiving one of the interleaved signal or the clock signal before it is applied to the AND device, said second delay device delaying the interleaved signal or the clock signal one half of the clock period so that the clock pulses in the clock signal are in phase with the data pulses in the data signal when they are applied to the AND device.

7. The decoder according to claim 6 wherein the first delay device and the second delay device are Josephson transmission lines.

8. The decoder according to claim 6 wherein the AND device is a superconducting coincident device.

9. The decoder according to claim 6 wherein the first delay device delays the clock signal by 1.5 times half of the clock period.

10. The decoder according to claim 6 wherein the flip-flop device synchronizes to the clock pulses when no data pulse occurs between two clock pulses in the interleaved signal.

11. The decoder according to claim 6 wherein the clock signal has a speed between 20–200 Gb/s.

12. A superconducting decoder for decoding a data signal and a clock signal encoded on an interleaved signal, said data signal including SFQ data pulses and said clock signal including SFQ clock pulses that are 180° apart in phase, said clock pulses defining a clock period, said decoder comprising:

a latch device responsive to the interleaved signal and extracting the clock signal therefrom; and a first delay device responsive to the clock signal from the latch device, said first delay device delaying the clock signal for a time period between one half of the clock period and one clock period and generating a first delayed clock signal, said first delayed clock signal being applied to the latch device at a time that prevents data pulses in the interleaved signal from being outputted from the latch device.

13. The decoder according to claim 12 further comprising an AND device and a second delay device, said second delay device being responsive to the clock signal from the latch device, said second delay device delaying the clock signal by one half of the clock period and generating a second delayed clock signal so that the clock pulses in the second delayed clock signal are in phase with the data pulses in the interleaved signal, said AND device being responsive to the interleaved signal and the second delayed clock signal, and outputting the data signal.

14. The decoder according to claim 12 further comprising an AND device and a second delay device, said second delay device being responsive to the interleaved signal, said second delay device delaying the interleaved signal by one half of the clock period and generating a delayed interleaved signal so that the clock pulses in the clock signal are in phase with the data pulses in the delayed interleaved signal, said AND device being responsive to the clock signal form the latch device and the delayed interleaved signal and outputting the data signal.

15. The decoder according to claim 12 wherein the first delay device is a Josephson transmission line.

16. The decoder according to claim 12 wherein the AND device is a superconducting coincident device.

17. The decoder according to claim 12 wherein the first delay device delays the clock signal by 1.5 times half of the clock period.

18. The decoder according to claim 12 wherein the flip-flop device synchronizes to the clock pulses when no data pulse occurs between two clock pulses in the interleaved signal.

19. A method of decoding a data signal and a clock signal encoded on an interleaved signal, said data signal including SFQ data pulses and said clock signal including SFQ clock pulses that are 180° apart in phase, said clock pulses defining a clock period, said method comprising:

applying the interleaved signal to a latch device that outputs the clock signal;

delaying the clock signal from the latch device for a time period between one half of the clock period and one clock period; and applying the delayed clock signal to the latch device for putting the latch device in a "1" state at a time that prevents data pulses in the interleaved signal from being outputted from the latch device.

20. The method according to claim 19 further comprising delaying the clock signal from the latch device by one half of the clock period so that the data pulses and the clock pulses in the one-half period delayed clock signal are in phase, and applying the interleaved signal and the one-half period delayed clock signal to an AND device, said AND device outputting the data signal.

21. The method according to claim 19 further comprising delaying the interleaved signal by one half of the clock period so that the data pulses in the interleaved signal are in phase with the clock pulses in the clock signal, and applying the delayed interleaved signal and the clock signal to an AND device, said AND device outputting the data signal.

22. The method according to claim 19 wherein delaying the clock signal from the latch device includes delaying the clock signal in a Josephson transmission line.

23. The method according to claim 19 wherein delaying the clock signal from the latch device includes delaying the clock signal by 1.5 times half of the clock period.

* * * * *